US012135348B2

(12) United States Patent
Freedman et al.

(10) Patent No.: US 12,135,348 B2
(45) Date of Patent: Nov. 5, 2024

(54) SUBSTRATE TESTING WITH THREE-DIMENSIONAL SCANNING

(71) Applicant: Mellanox Technologies, Ltd., Yokneam Illit (IL)

(72) Inventors: Barak Freedman, Binyamina (IL); Amir Silber, Rehovot (IL)

(73) Assignee: Mellanox Technologies, Ltd., Yokneam (IL)

( * ) Notice: Subject to any disclaimer, the term of this patent is extended or adjusted under 35 U.S.C. 154(b) by 144 days.

(21) Appl. No.: 17/894,871

(22) Filed: Aug. 24, 2022

(65) Prior Publication Data

US 2023/0288472 A1 Sep. 14, 2023

Related U.S. Application Data

(60) Provisional application No. 63/319,240, filed on Mar. 11, 2022.

(51) Int. Cl.
| | | |
|---|---|---|
| *G01R 31/28* | (2006.01) |
| *G01B 11/24* | (2006.01) |
| *G01N 21/95* | (2006.01) |
| *G06T 7/00* | (2017.01) |
| *G06T 7/62* | (2017.01) |

(52) U.S. Cl.
CPC ......... *G01R 31/2886* (2013.01); *G01B 11/24* (2013.01); *G01N 21/9501* (2013.01); *G06T 7/0004* (2013.01); *G06T 7/62* (2017.01); *G06T 2200/04* (2013.01); *G06T 2207/30148* (2013.01)

(58) Field of Classification Search
CPC ...... H01L 22/34; H01L 22/12; H01L 27/0688
See application file for complete search history.

(56) References Cited

U.S. PATENT DOCUMENTS

| | | | | |
|---|---|---|---|---|
| 2004/0031779 A1* | 2/2004 | Cahill | ............... | B23K 26/0853 |
| | | | | 257/E23.179 |
| 2004/0098216 A1* | 5/2004 | Ye | .................... | H01L 21/67276 |
| | | | | 702/127 |
| 2008/0099761 A1* | 5/2008 | Feustel | .................. | H01L 22/34 |
| | | | | 257/E23.001 |
| 2014/0084948 A1* | 3/2014 | Tendulkar | ......... | H01L 23/53266 |
| | | | | 257/E21.295 |
| 2015/0120243 A1* | 4/2015 | David | ............... | G01B 11/0625 |
| | | | | 702/172 |
| 2018/0247968 A1* | 8/2018 | Na | ........................ | H01L 29/161 |

* cited by examiner

*Primary Examiner* — Jermele M Hollington
*Assistant Examiner* — Temilade S Rhodes-Vivour
(74) *Attorney, Agent, or Firm* — Lowenstein Sandler LLP

(57) ABSTRACT

A substrate testing device includes a first testing component configured to couple to electrical pads of a substrate and perform electrical testing on one or more dies of the substrate during a test. The substrate testing device includes a second testing component configured to perform optical testing of the one or more dies during the test. The substrate testing device further includes a third testing component comprising a three-dimensional scanner configured to perform a dimensional scan of the one or more dies of the substrate, wherein the third testing component is to perform geometrical testing on the one or more dies during the test.

20 Claims, 6 Drawing Sheets

SUBSTRATE TESTING WITH THREE-DIMENSIONAL SCANNING

RELATED APPLICATION

This application claims the benefit of U.S. Provisional Patent Application No. 63/319,240, filed Mar. 11, 2022, which is incorporated by reference herein in its entirety.

TECHNICAL FIELD

At least one embodiment pertains to substrate testing with a three-dimensional scan according to various novel techniques described herein. For example, a substrate testing device can include a three-dimensional scanner to perform three-dimensional scans on a substrate while also including capabilities to electrically and optically test the substrate according to various novel techniques described herein.

BACKGROUND

During semiconductor device fabrication (e.g., during a substrate fabrication), a substrate testing device can perform a test on the substrate—e.g., substrate testing can occur before the substrate is sent to die preparation. The substrate test can test integrated circuits present on the substrate for functional defects. Generally, the substrate testing device can perform electrical and optical tests on the substrate—e.g., the substrate testing device is coupled to electrical pads connected to a top layer of the substrate and the substrate testing device injects optical power into the substrate. Some substrate testing devices further include a camera to take two-dimensional images of a surface of the substrate. Typically, a second substrate testing device (e.g., a separate testing device) is used to perform geometrical testing if such testing is warranted—e.g., a separate substrate testing device is used to measure a surface topography of the substrate. Having separate substrate testing devices to perform optical and electrical testing and geometrical testing can increase overall test times, increase risks of damaging the substrate while transferring the substrate between substrate testing devices, and make error diagnostics more difficult.

BRIEF DESCRIPTION OF DRAWINGS

Various embodiments in accordance with the present disclosure will be described with reference to the drawings, in which.

DETAILED DESCRIPTION

Figure 1:
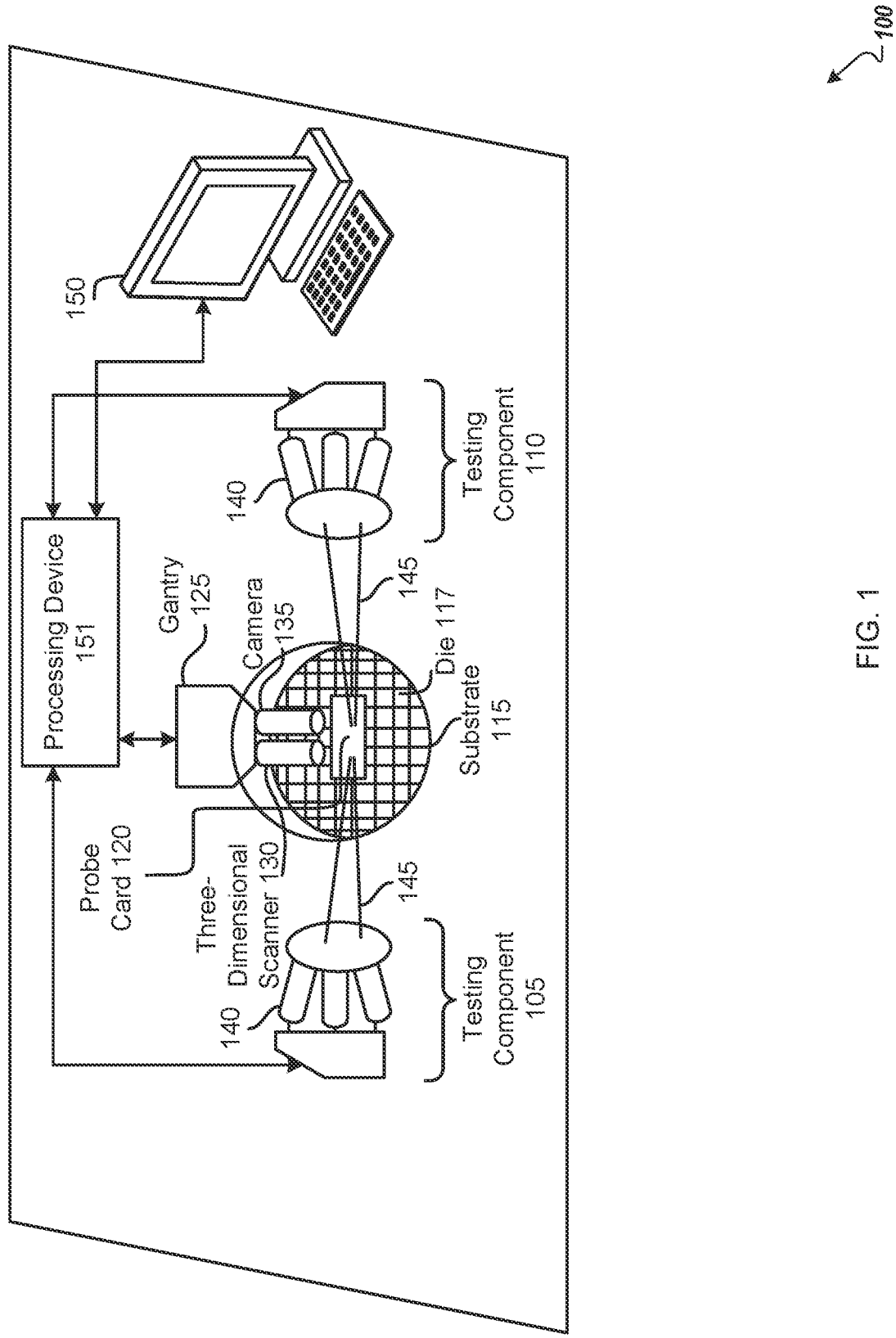
FIG. 1 illustrates an example substrate testing system implementing a substrate test with a three-dimensional scan, in accordance with at least some embodiments.

During fabrication of devices such as semiconductor devices, micro-electromechanical system (MEMS) devices and optoelectronic devices, substrates can be tested before die preparation occurs. Testing the substrate electrically, optically, and geometrically can be important in device fabrication. Embodiments described herein provide a system and method to perform substrate testing electrically and optically with three-dimensional scanning for the geometric testing.

Some systems can be fabricated in and on a substrate. Before die preparation occurs (e.g., before the substrate is prepared for integrated circuit (IC), MEMS and/or optoelectrical device packaging and testing), a substrate is tested via a substrate testing device. Typically, a substrate testing device performs either electrical and optical tests or geometrical tests. For example, a substrate testing device may include a probe card (a set of pins, pads, bumps, contacts, etc.) to electrically test the substrate—e.g., electrical pads are connected to a top metal layer of the substrate to perform the electrical tests. Additionally, the substrate testing device can include fiber alignment to inject optical power or light into the substrate to perform optical testing. The substrate testing device can include a camera to assist in the alignment of either an electrical probe or of the optical fibers. The two-dimensional image of the camera fails to assist with the alignment in many instances however. For example, the camera image may not be used to detect the depth of a feature on the substrate due to the reflective nature of the substrate and/or may cause the alignment to be inaccurate.

Some systems can include components edge coupling and/or other geometric attributes important for the functionality of the system. For example, systems can include silicon photonics, silicon waveguides, or micro-electromechanical systems (MEMS) devices where functionality of the component can depend on the geometric attributes of the device. For example, silicon photonic components can include V-grooves or channels that improve waveguide attributes of the component—e.g., acoustic surface waves can propagate better along an immersed V-groove having a specific angle. To ensure the geometric attributes are fabricated correctly, the substrate can be tested geometrically at a different substrate testing device than the substrate testing device performing the electrical and optical tests.

Typically, performing electrical and optical tests for the substrate separate from performing geometric tests for the substrate can increase testing times—e.g., additional test time is added when moving the substrate from a first substrate device to a second substrate device to and performing the additional geometric test. Additionally, transferring the substrate between substrate testing devices can increase risks related to substrate handling—e.g., increase the risk the substrate is damaged during testing or increase the risk the substrate is contaminated during transfer. Further, error diagnostics can be more difficult when electrical and optical tests are performed at different times than the geometrical test. For example, it can be difficult to ascertain whether there is an issue with optical power of the substrate or an issue with a geometric attribute of the substrate when the tests are performed independently.

Advantageously, aspects of the present disclosure can address the deficiencies above and other challenges by providing a system and a method for substrate testing with a three-dimensional scan. For example, a substrate testing device and method described herein can perform an electrical test, an optical test, and a geometric test. In some examples, the substrate testing device can perform the electrical test, the optical test, and/or geometric test concurrently. In other examples, the substrate testing device can perform the electrical test, the optical test and/or the geometric test (e.g., based on a 3D scanner) sequentially. For example, the substrate testing device can include a first component associated with electrical testing. The first component can include an electrical probe that couples with a surface layer of the substrate via a prove card or electrical pad. The first component can perform the electrical testing by aligning the electrical probe and measuring voltages and signals of the substrate. The substrate can include a second component associated with optical testing. For example, the second component can include a fiber alignment probe that injects optical power or light into the substrate. The second component can perform the optical testing by aligning the fiber alignment probe and measuring optical power. The substrate testing device can also include a three-dimensional scanner. The three-dimensional scanner of the substrate device can perform geometrical testing of the substrate by performing three-dimensional scans. In some examples, a camera (e.g., a two-dimensional camera) can also be included. In other examples, the three-dimensional scanner can include a camera—e.g., be able to capture two-dimensional images. The three-dimensional scanner can also be used to help align the electrical and optical probes—e.g., the substrate testing device can perform a three-dimensional scan and use the results of the three-dimensional scan to align the electrical and/or optical probes to perform the electrical and/or optical testing.

By utilizing a substrate testing device with a three-dimensional scanner, a component to perform electrical tests, and a component to perform optical tests, the substrate testing device can reduce a time to conduct the tests as compared with conventional solutions. Additionally, by enabling the geometric, electrical, and optical testing, the substrate testing device described herein can reduce a risk associated with handling the substrate. Further, error diagnostics can be improved by having the substrate device perform the electrical, optical, and geometric tests. For example, performing the three-dimensional scan and optical test at the same substrate testing device can improve error diagnostics and enable a user to determine whether an error is related to optical power or a defect associated with a geometrical attribute of the substrate. Accordingly, improved substrate testing with three-dimensional scans is described herein.

Figure 4:
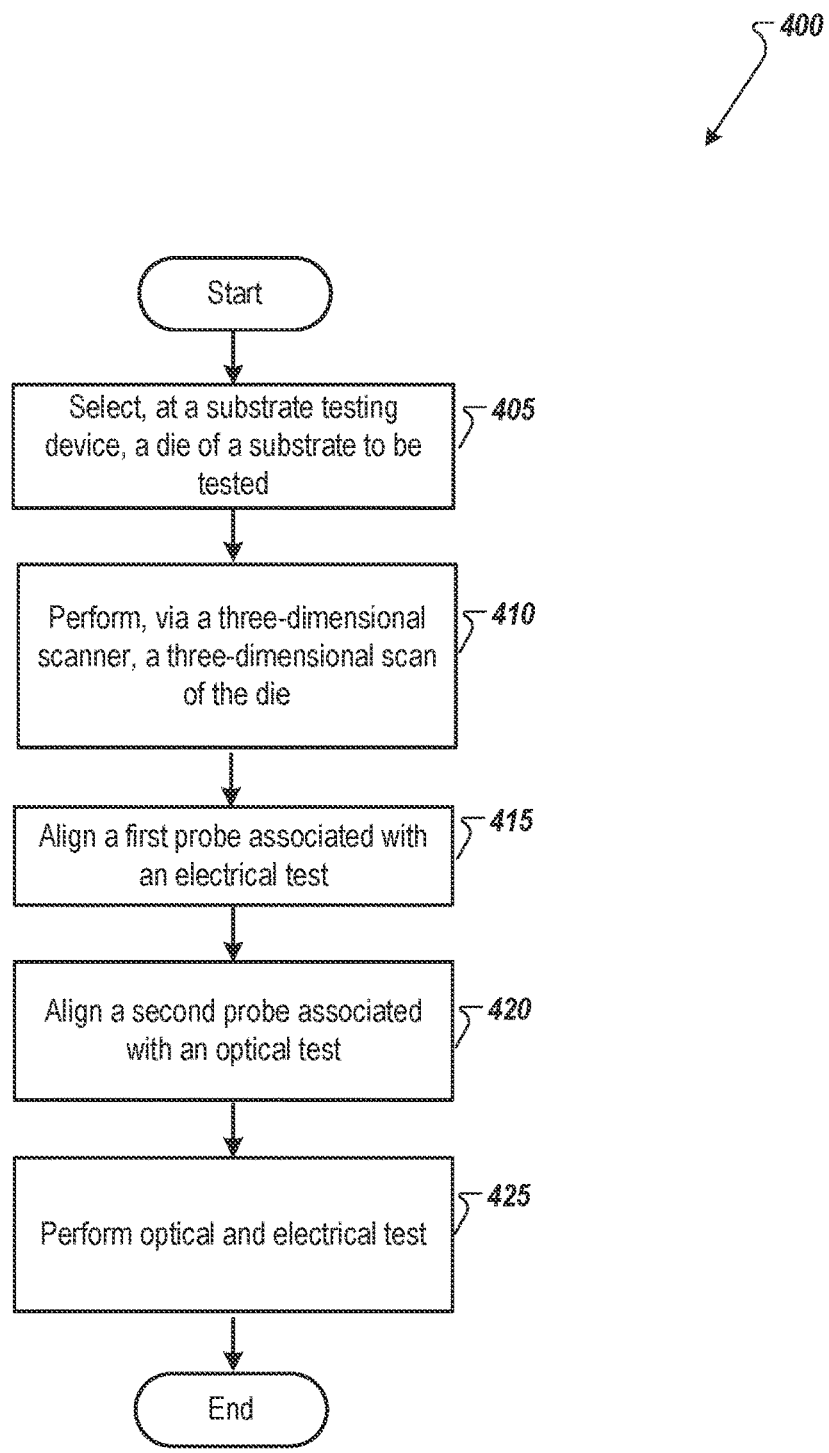
FIG. 4 is a flow diagram of a method for substrate testing with a three-dimensional scan, in accordance with at least some embodiments.

FIG. 1 illustrates an example substrate testing system 100 according to at least one example embodiment. The substrate testing system 100 can be utilized to perform tests on integrated devices such as semiconductor devices, MEMS devices and/or optoelectronc devices. In an example, one or more components of the example communication system 400 as described with reference to FIG. 4 are tested using substrate testing system 100. The substrate testing system 100 can include testing component 105, testing component 110, a three-dimensional scanner 130 and/or a camera 135 coupled to a gantry 125. The substrate testing system 100 may additionally include a display 150. The substrate testing system 100 can test a substrate 115 with a number of dies 117—e.g., test each die 117 or a group of dies 117. In some embodiments, testing component 105 and testing component 110 can be separate testing components—e.g., testing component 105 can be associated with electrical testing and testing component 110 can be associated with optical testing. In other embodiments, testing component 105 and testing component 110 can be a pair of testing components—e.g., testing component 105 can be associated with an input signal and testing component 110 can be associated with an output signal. In such embodiments, testing component 105 and testing component 110 can be associated with both electrical and optical testing or there can be additional testing component pairs for additional tests—e.g., testing component 105 and testing component 110 can be associated with electrical testing and an additional testing component pair not illustrated can be associated with optical testing. Each of testing component 105 and testing component 110 can include axes 140 (e.g., one or more axis 140) and probes 145 (e.g., wires for performing optical and electrical tests).

In at least one embodiment, testing component 105 and testing component 110 are configured to perform electrical and/or optical tests on the substrate 115. For example, testing component 105 and testing component 110 can transmit electrical signals to the substrate 115 via the probes 145 and a probe card 120—e.g., the substrate testing system 100 is coupled to electrical pads of a top metal layer of the substrate 115 via the probe card 120. The testing component 105 and testing component 110 can also be configured to receive return electrical signals from the substrate 115 in order to perform electrical testing. For example, by sending and receiving electrical signals, testing component 105 and testing component 110 can determine characteristics of the substrate 115, determine a reliability of the substrate 115, and/or determine errors associated with substrate 115. In other embodiments, testing component 105 and testing component 110 can perform optical tests to measure various optical characteristics of the substrate 115—e.g., measure insertion loss, bandwidth, peak wavelength, propagation loss, bend loss, cross-talk, power coupling, excess loss, dark current, responsivity, etc. For example, the testing component 105 and testing component 110 may perform tests to measure fiber grating coupler performance, to measure propagation loss, and/or to perform modulator tests. In at least one embodiment, the testing component 105 and testing component 110 can couple to various different parts of the substrate 115 or dies 117 to perform the optical testing—e.g., to grating couplers, waveguide spirals, crossings, transitions, directional coupling, splitters, photo diodes, interferometer, phase sifter loss, etc. In such embodiments, the testing component 105 and testing component 110 can include a fiber alignment probe 145 to inject and receive optical power into the substrate 115. Each of testing component 105 and testing component 110 can include one or more axes 140 for better positioning and alignment of probes 145 during testing of substrate 115. It should be noted that a 3 axis 140 configuration is shown as an example only and other axis configurations are possible. For example, testing component 105 and testing component 110 can include a 6 axis or 9 axis configuration for more precise positioning and alignment. In at least one embodiment, testing component 105 and testing component 110 can include and utilize polarization control, power meters, motion control, a laser source, etc., during the test of substrate 115.

Substrate 115 is configured to undergo testing at the substrate testing system 100. In some embodiments, substrate 115 can be tested at the substrate testing system 100 before die 117 are prepared—e.g., before substrate 115 is prepared for integrated circuit (IC) packaging and IC testing. In at least one embodiment, substrate 115 includes silicon photonics. In such embodiments, the substrate 115 can include one or more geometric attributes. For example, the substrate 115 can include V-grooves for better fiber coupling and enable acoustic surface waves to propagate better along the surface of the substrate 115. In other embodiments, the substrate 115 can include other geometric attributes for coupling or reducing waveguide loss. In at least one embodiment, the substrate 115 can include a micro-electromechanical system (MEMS). In at least one embodiment, the substrate 115 can be coupled to a substrate chuck of the substrate testing system 100. The substrate chuck can be configured to raise and lower the substrate 115 during the test as needed.

Probe card 120 is configured to couple probes 145 of testing component 105 and testing component 110 to the substrate 115. Needles of probe card 120 contact electrodes or electrical pads of the substrate 115 to conduct electrical and/or optical testing. Although not illustrated, the probe card 120 can be coupled with a spring contact pin, a performance board, a test head, etc., to be held in place during the test.

Three-dimensional scanner 130 is configured to perform a three-dimensional scan on at least a portion of the substrate 115. In some embodiments, three-dimensional scanner 130 is coupled to a gantry 125. In such embodiments, the three-dimensional scanner 130 can be moved around (e.g., motorized) and take three-dimensional scans of different areas of interest (AOIs) as the test of the substrate 115 progresses. In some embodiments, the three-dimensional scanner 130 can be coupled with or placed next to a camera 135. In other embodiments, the three-dimensional scanner 130 is also configured to capture two-dimensional images during the testing—e.g., the three-dimensional scanner 130 can include both a three-dimensional scanner and a two-dimensional camera. In other embodiments, the three-dimensional scanner 130 can be placed anywhere along the gantry 125 or other places where the die 117 and substrate 115 are visible to the three-dimensional scanner 130 for the scan—e.g., the location of the three-dimensional scanner 130 is not limited by the position illustrated in FIG. 1. In at least one embodiment, the three-dimensional scanner 130 is configured to perform a scan on a die 117. In some embodiments, the three-dimensional scanner 130 is configured to perform a scan on an AOI that encompasses multiple dies 117—e.g., the size of the three-dimensional scan can vary. In at least one embodiment, the three-dimensional scanner 130 can facilitate geometric testing of the substrate 115—e.g., determine dimensions of geometric attributes of the substrate 115. For example, the three-dimensional scanner 130 can be configured to scan V-grooves of the substrate 115 to determine the dimensions of the V-groove.

In at least one embodiment, the three-dimensional scanner 130 is configured to perform the three-dimensional scan before the electrical and/or optical testing. In such embodiments, the substrate testing system 100 can utilize the results of the three-dimensional scan to better align the electrical or optical probe 145. In other embodiments, the three-dimensional scanner 130 is configured to perform the scan in parallel with the electrical and/or optical testing.

In some embodiments, the three-dimensional scanner 130 can perform the three-dimensional scan by using a structured-light three-dimensional scan. For example, the three-dimensional scanner 130 may include one or more structured light projectors and one or more sensors (e.g., charge coupled devices (CCDs) or complementary metal-oxide semiconductor (CMOS) type image sensors). The structured light projectors may be configured to output structured light having one or a few known wavelengths in some embodiments. The structured light projectors can project structured light patterns—e.g., dot or stripe patterns. The structured light reflected off of an imaged surface may be captured by the one or more image sensors, and a distortion of the structured light caused by the surface onto which the structured light was projected may be used to determine depth measurements for points on the surface. In some embodiments, the three-dimensional scanner 130 can perform the three-dimensional scan by using a time of flight scan—e.g., by measuring a round trip time of an artificial light signal transmitted by the three-dimensional scanner 130.

In some embodiments, the three-dimensional scanner 130 can include confocal optics and one or more image sensors for performing confocal scanning. For example, three-dimensional scanner 130 may adjust the relative location of a focal surface of focusing optics along a Z-axis, where the z-axis is an imaging axis associated with depth. The three-dimensional scanner may axially displace the focusing optics to change a depth of the focal surface. The three-dimensional scanner may determine the relative intensity in each pixel of a received intraoral scan over the entire range of focal settings of the focusing optics. Once a certain point associated with a particular pixel is in focus, the measured intensity will be maximal for that pixel. Thus, by determining the depth corresponding to the maximal light intensity or by determining the maximum displacement derivative of the light intensity, for each pixel, the depth of each pixel can be determined.

In some embodiments, the three-dimensional scanner 130 can be an example of a stereo camera array that performs the three-dimensional scan. The stereo camera array may include two or more image sensors having a known separation, and image data from each of the cameras in the stereo camera array may be used to determine depth data for pixels in the images. It should be noted the three-dimensional scanner 130 could use any combination of the examples listed above to generate three-dimensional data or utilize any other three-dimensional scan technique to capture the three-dimensional scan of the substrate 115.

Camera 135 is configured to capture two-dimensional images. Camera may be a color camera or a camera configured to capture images from light having one or more specified wavelength. In some embodiments, the camera 135 can capture a two-dimensional image of die 117. In other embodiments, the camera 135 can capture a two-dimensional image of an AOI larger than a die—e.g., capture a two-dimensional image of one or more dies 117. In some embodiments, the substrate testing system 100 can utilize the results of the two-dimensional image to align the electrical and optical probes. In some embodiments, the camera 135 is coupled to gantry 125 and is positioned next to the three-dimensional scanner 130.

In some embodiments, substrate testing system 100 includes a processing device 151 that processes data from the testing component 105, testing component 110, three-dimensional scanner 130 and/or camera 135. Processing device 151 may generate a three-dimensional model of the tested one or more die based on the three-dimensional scan or scans. This may include stitching together multiple 3D images or scans based on overlapping features of the 3D images or scans in some embodiments. Processing device may then perform geometric analysis of the tested one or more dies based on the generated three-dimensional model of the tested one or more die. The geometric analysis may include any visible structure, for example, measuring one or more critical dimensions (CDs) of the die, which may include depth-based critical dimensions. In one example, the geometric analysis includes determining a depth and/or slope of a v-groove for a groove of an optoelectronic device, grating couples, etch depth and shape, bumps shape, mirrors shapes, fiducials for mechanical alignment.

Display 150 is configured to display a graphical user interface (GUI) that presents the results of the electrical, optical, and/or geometric testing—e.g. the display 150 can show the three-dimensional scan taken by the three-dimensional scanner 130 and/or the 3D model generated from the 3D scan(s). In some embodiments, the display 150 can be configured to display a GUI that enables a user to move the substrate 115, the probes 140 of testing component 105 and testing component 110, or the gantry 125 for better alignment and testing—e.g., the display 150 can present a GUI that enables a user to move around the three-dimensional scanner 130 for a better scan of geometric attributes of the substrate 115. In some embodiments, the display 150 can be coupled to a server or other memory system that stores the information of the test result. In some embodiments, the display 150 can display results of the geometric test, electrical, and optical tests in parallel or concurrently. Displaying all test results concurrently can enable better error diagnostics. For example, it can be determined if a lack of optical power receive is due to a lack of optical power from the substrate 115 or based on a bad alignment between the optical probe 140 and the substrate 115—e.g., the results of the three-dimensional scan can indicate whether the optical probe was aligned correctly.

Figure 2:
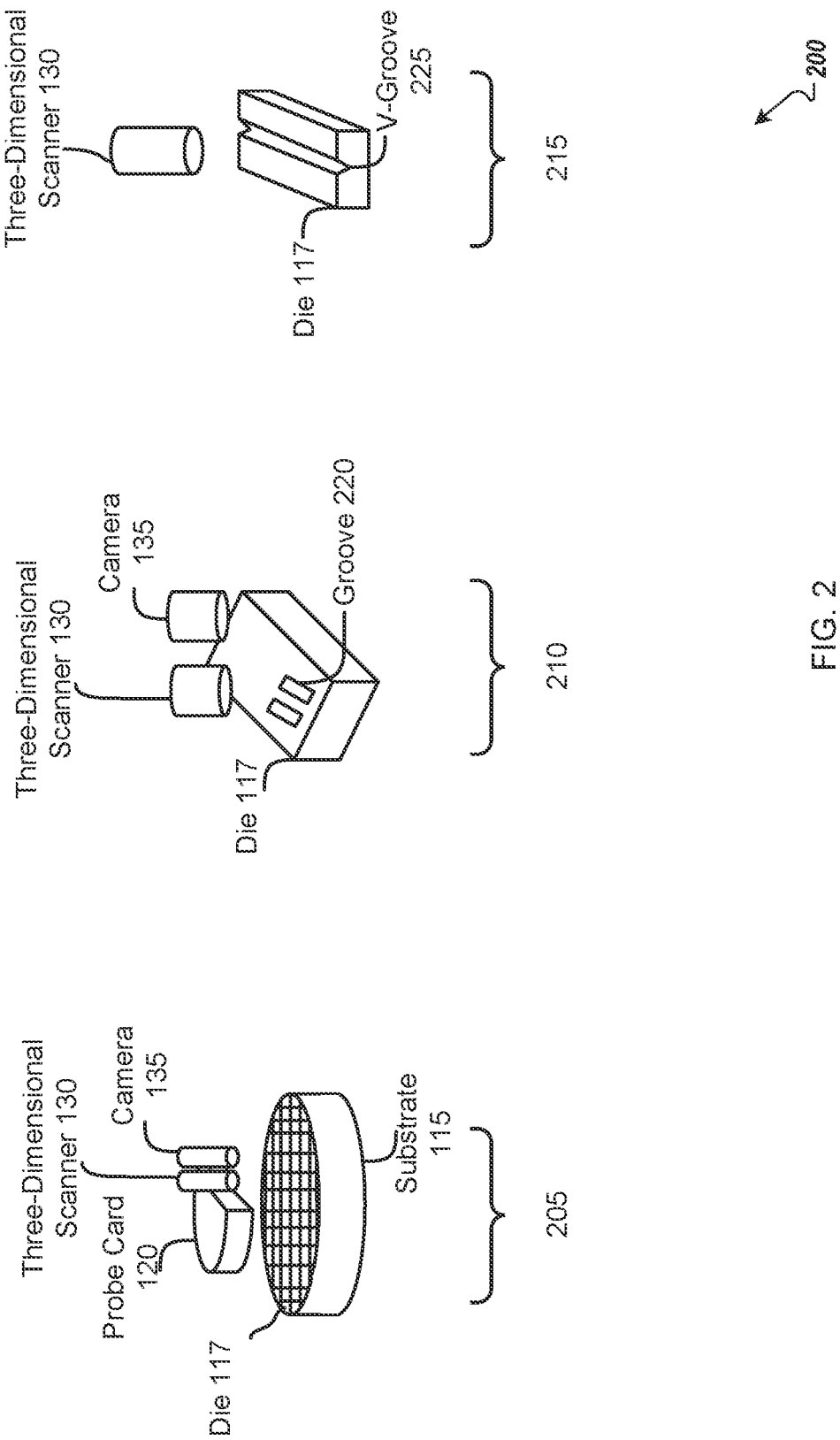
FIG. 2 illustrates examples of a substrate test with a three-dimensional scan, in accordance with at least some embodiments.

FIG. 2 illustrates a diagram 200 showing examples of a substrate test with a three-dimensional scan. In some embodiments, diagram 200 illustrates positions of components of a substrate testing system—e.g., substrate testing system 100 as described with reference to FIG. 1. For example, diagram 200 illustrates positions of the substrate 115, dies 117, probe card 120, three-dimensional scanner 130, and camera 135. In some embodiments, diagram 200 illustrates the position of the three-dimensional scanner 130 and camera 135 relative to a groove 220 or V-groove 225 of a die 117. In some embodiments, diagram 200 illustrates the position of the three-dimensional scanner 130 and camera 135 relative to a fiducial 230.

At 205, diagram 200 illustrates three-dimensional scanner 130 being placed above an area of interest (AOI) on substrate 115. In some embodiments, the three-dimensional scanner 130 can be placed over a single die 117. In other embodiments, the three-dimensional scanner 130 can be placed over multiple dies 117—e.g., the three-dimensional scan captured of a surface topography of the substrate 115 can span over an area of multiple dies 117. In some embodiments, the probe card 120 can be moved out of the way to enable the three-dimensional scanner 130 to capture a three-dimensional scan of the substrate 130. In at least one embodiment, the camera 135 can be positioned next to the three-dimensional scanner 130.

At 210, diagram 200 illustrates three-dimensional scanner 130 being placed over grooves 220 on a die 117. In some embodiments, three-dimensional scanner 130 can be utilized to determine dimensions of geometric attributes of dies 117. For example, the three-dimensional scanner 130 can be utilized to measure dimensions of the grooves 220. In such embodiments, the three-dimensional scanner 130 can be moved around by the gantry 125 until the three-dimensional scanner 130 is positioned over the groove 220. As described with reference to FIG. 1, the substrate testing system can include a display 150 that enables a user to position the three-dimensional scanner 130 above the grooves 220. In some embodiments, the three-dimensional scanner 130 can take a three-dimensional scan of both grooves 220 or take a scan of each groove 220 independently. In at least one embodiment, grooves 220 can be associated with a keep out zone for electrical pads. In such embodiments, the camera 135 can be kept away from grooves 220—e.g., the camera 135 can be far enough apart on the gantry 125 from the three-dimensional scanner 130 such that the camera 135 does not disturb the grooves 320 or the three-dimensional scan. In at least one embodiment, the camera 135 can be positioned based on a fiducial 230 (e.g., a fiducial marker). In such embodiments, the fiducial 230 can enable the camera 135 to be aligned more accurately over the die 117.

At 215, diagram 200 illustrates three-dimensional scanner 130 being placed over a V-groove 225 during a test of substrate 115. In some embodiments, the three-dimensional scanner 130 can be positioned over the V-groove 225 in such a manner that the results of the three-dimensional scan indicate a width, depth, and side wall roughness of the V-groove 225. The results of the three-dimensional scan can enable determining whether the V-groove 225 was properly etched—e.g., determine whether a measured dimension of the V-groove 225 satisfies (e.g., is within a tolerable range of) an expected dimension of the V-groove 225, such as a threshold depth, a threshold slope, a threshold width, etc. In some embodiments, the three-dimensional scanner 130 can scan the V-groove 225 concurrent with the substrate testing system performing electrical and optical testing. In other embodiments, the three-dimensional scanner 130 can scan the V-groove 225 before or after the electrical and optical testing. In some embodiments, the substrate testing system can perform only one of an electrical test, an optical test, or a geometric test.

Figure 3:
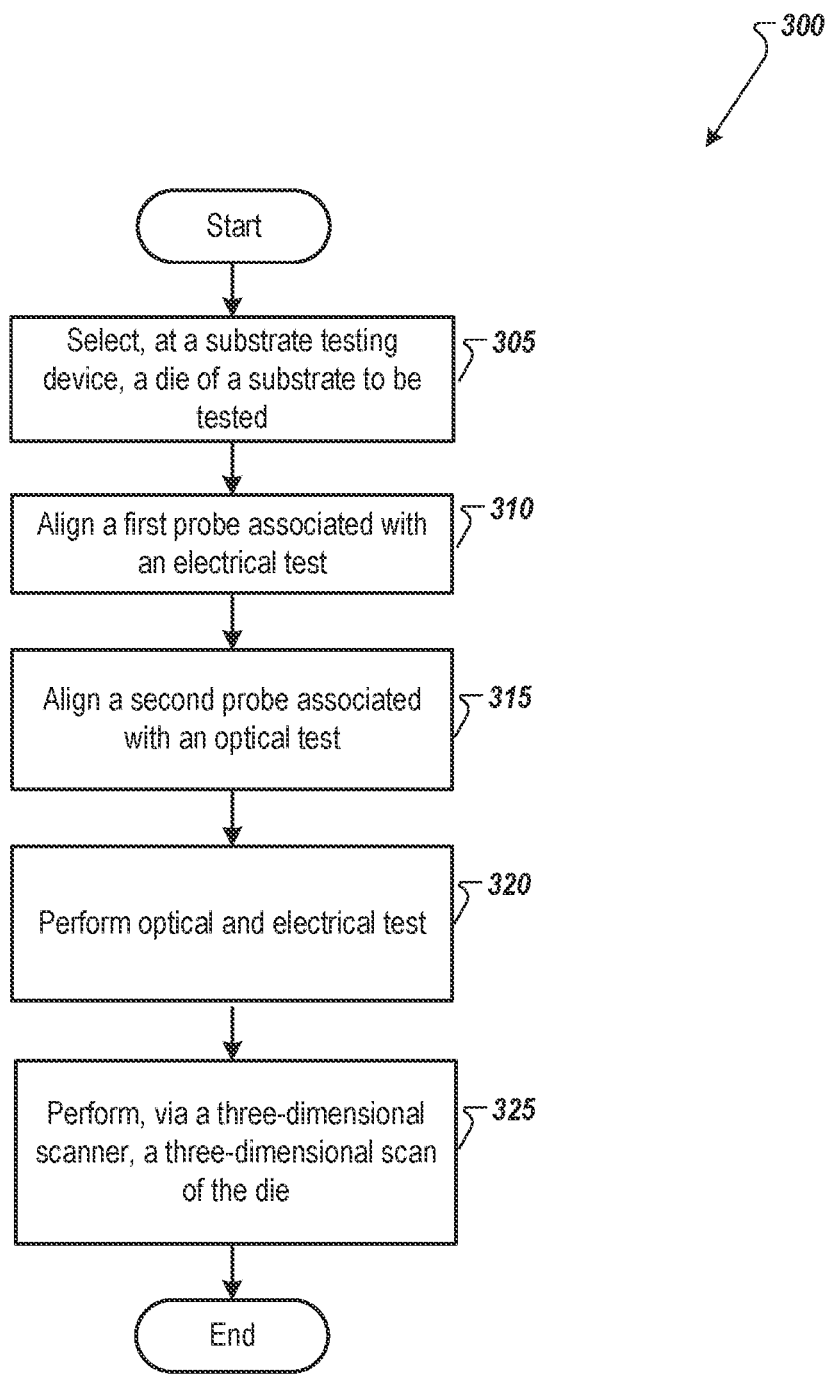
FIG. 3 is a flow diagram of a method for substrate testing with a three-dimensional scan, in accordance with at least some embodiments.

FIG. 3 illustrates a flow diagram of a method 300 for substrate testing with a three-dimensional scan. The method 300 can be performed by processing logic comprising hardware, software, firmware, or any combination thereof. In at least one embodiment, the method 300 is performed by substrate testing system 100 as described with reference to FIG. 1. For example, by testing component 105, testing component 110, three-dimensional scanner 130, camera 135, display 150, and probes 145 as described with reference to FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other diagrams illustrating a method substrate testing with three-dimensional scanning are possible.

At operation 305, processing logic of a substrate testing device can select a die of a substrate to be tested. In some embodiments, the processing logic can select one or more dies of the substrate to be tested—e.g., the three-dimensional scanner 130 can perform scans over an area of interest larger than an area of die 117 as described with reference to FIG. 1. As described with reference to FIG. 1, the display 150 can present a graphical user interface (GUI) enabling a user to position the three-dimensional scanner 130—e.g., the user can select an area on the substrate for the three-dimensional scan and the substrate testing system can automatically move the three-dimensional scanner 130 to the position indicated. In at least one embodiment, the substrate is a wafer comprising a silicon photonic or a micro-electro-mechanical system (MEMS).

At operation 310, processing logic can align a first probe of the substrate testing device associated with an electrical test to the die of the substrate. For example, the processing logic can align a first testing component (e.g., testing component 105) and couple the first testing component with electrical pads of the substrate—e.g., couple the first testing component with the substrate via a probe card. In some embodiments, the processing logic can align additional probes associated with electrical testing as well—e.g., align an input probe as well as an output probe.

At operation 315, processing logic can align a second probe of the substrate testing device associated with an optical test to the die of the substrate. For example, the processing logic can align a second testing component (e.g., testing component 110) and couple the second testing component with the substrate 115. For example, the second testing component can include a fiber alignment probe (e.g., the second prove can be an example of a fiber alignment probe) and couple with the substrate 115 to inject optical power into the substrate 115. In some embodiments, the processing logic can align additional probes associated with optical testing as well—e.g., align an input probe as well as an output probe for the optical testing. In at least one embodiment, the processing logic can perform a three-dimensional scan before aligning the first probe or the second probe. In such examples, the processing logic can align the first probe or the second probe based on a result of the three-dimensional scan. In at least one embodiment, the processing logic can align the first probe and second probe concurrently or in parallel. In other embodiments, the processing logic can align the first probe before the second probe or the second probe before the first probe—e.g., the alignment can occur at different times.

At operation 320, the processing logic can perform the optical and electrical tests based on aligning the first probe and the second probe. For example, the processing logic can transmit and receive electrical signals to and from the substrate 115. In some embodiments, the processing logic can inject optical power into the substrate to perform optical testing. In some embodiments, the substrate testing system can include a gantry and a camera coupled to the gantry. In such embodiments, the camera can capture two-dimensional images of the die (or of one or more dies) during the test of the substrate. In at least one embodiment, the processing logic can utilize the camera to align the first probe or the second probe.

At operation 325, the processing logic can, via the three-dimensional scanner (e.g., third testing component), perform a three-dimensional scan of the die of the substrate. In some embodiments the processing can, via the three-dimensional scanner, perform a second three-dimensional scan of one or more dies of the substrate. In at least one embodiment, the three-dimensional scan of the die is concurrent or in parallel with the performance of the electrical and optical tests. In some embodiments, the processing logic can initiate the three-dimensional scan before or after the electrical and optical testing. In some embodiments, the processing logic can initiate the three-dimensional can to perform geometrical testing on the one or more dies. In at least one embodiment, the processing logic can refrain from performing any one of the optical, electrical, or geometric tests. In at least one embodiment, the three-dimensional scanner is further configured to capture two-dimensional images during the testing—e.g., the third testing component includes both the three-dimensional scanner and a camera. In some embodiments, the three-dimensional scanner is configured to perform at least one of a structured-light three-dimensional scan, a time of flight scan, a confocal scan, a stereo camera array scan, or any combination thereof to generate three-dimensional data. In at least one embodiment, the three-dimensional scanner is configured to scan and determine dimensions of a groove in the substrate—e.g., determine width, depth, and side wall roughness of a V-groove.

FIG. 4 illustrates a flow diagram of a method 400 for substrate testing with a three-dimensional scan. The method 400 can be performed by processing logic comprising hardware, software, firmware, or any combination thereof. In at least one embodiment, the method 400 is performed by substrate testing system 100 as described with reference to FIG. 1. For example, by testing component 105, testing component 110, three-dimensional scanner 130, camera 135, display 150, and probes 145 as described with reference to FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other diagrams illustrating a method substrate testing with three-dimensional scanning are possible.

At operation 405, processing logic of a substrate testing device can select a die of a substrate to be tested. In some embodiments, the processing logic can select one or more dies of the substrate to be tested—e.g., the three-dimensional scanner 130 can perform scans over an area of interest larger than an area of die 117 as described with reference to FIG. 1. As described with reference to FIG. 1, the display 150 can present a graphical user interface (GUI) enabling a user to position the three-dimensional scanner 130—e.g., the user can select an area on the substrate for the three-dimensional scan and the substrate testing system can automatically move the three-dimensional scanner 130 to the position indicated. In at least one embodiment, the substrate is a wafer comprising a silicon photonic or a micro-electro-mechanical system (MEMS).

At operation 415, the processing logic can, via the three-dimensional scanner (e.g., third testing component), perform a three-dimensional scan of the die of the substrate. In at least one embodiment, the three-dimensional scan of the die is before the performance of the electrical and optical tests. In at least one embodiment, the processing logic can perform the three-dimensional scan to better align the electrical or optical probe 145—e.g., the processing logic can use the results of the three-dimensional scan to better align the electrical or optical probe 145. For example, the processing logic can perform a geometric analysis to look at a visible structure. For example, the processing logic can measure one or more critical dimensions (CDs) of the die, which may include depth-based critical dimensions. In one example, the geometric analysis includes determining a depth and/or slope of a v-groove for a groove of an optoelectronic device, grating couples, etch depth and shape, bumps shape, mirrors shapes, fiducials for mechanical alignment. In some embodiments, the processing logic can use the geometrical analysis to determine where to position or align the electrical and optical probes e.g., use the geometric analysis to determine a v-groove or fiducial to align the electrical and optical probes to.

In some embodiments the processing can, via the three-dimensional scanner, perform a second three-dimensional scan of one or more dies of the substrate. In some embodiments, the processing logic can initiate the three-dimensional can to perform geometrical testing on the one or more dies. In at least one embodiment, the three-dimensional scanner is further configured to capture two-dimensional images during the testing—e.g., the third testing component includes both the three-dimensional scanner and a camera. In some embodiments, the three-dimensional scanner is configured to perform at least one of a structured-light three-dimensional scan, a time of flight scan, a confocal scan, a stereo camera array scan, or any combination thereof to generate three-dimensional data. In at least one embodiment, the three-dimensional scanner is configured to scan and determine dimensions of a groove in the substrate—e.g., determine width, depth, and side wall roughness of a V-groove.

At operation 415, processing logic can align a first probe of the substrate testing device associated with an electrical test to the die of the substrate responsive to performing the three-dimensional scan—e.g., align the first probe after performing the geometric analysis. For example, the processing logic can align the first probe to a v-groove after performing the geometric analysis. For example, the processing logic can align a first testing component (e.g., testing component 105) and couple the first testing component with electrical pads of the substrate—e.g., couple the first testing component with the substrate via a probe card. In some embodiments, the processing logic can align additional probes associated with electrical testing as well—e.g., align an input probe as well as an output probe.

At operation 420, processing logic can align a second probe of the substrate testing device associated with an optical test to the die of the substrate responsive to performing the three-dimensional scan—e.g., align the second probe after performing the geometric analysis. For example, the processing logic can align the second probe to a v-groove after performing the geometric analysis. In some embodiments, the processing logic can align a second testing component (e.g., testing component 110) and couple the second testing component with the substrate 115. For example, the second testing component can include a fiber alignment probe (e.g., the second prove can be an example of a fiber alignment probe) and couple with the substrate 115 to inject optical power into the substrate 115. In some embodiments, the processing logic can align additional probes associated with optical testing as well—e.g., align an input probe as well as an output probe for the optical testing. In at least one embodiment, the processing logic can align the first probe and second probe concurrently or in parallel. In other embodiments, the processing logic can align the first probe before the second probe or the second probe before the first probe—e.g., the alignment can occur at different times.

At operation 425, the processing logic can perform the optical and electrical tests based on aligning the first probe and the second probe. For example, the processing logic can transmit and receive electrical signals to and from the substrate 115. In some embodiments, the processing logic can inject optical power into the substrate to perform optical testing. In some embodiments, the substrate testing system can include a gantry and a camera coupled to the gantry. In such embodiments, the camera can capture two-dimensional images of the die (or of one or more dies) during the test of the substrate. In at least one embodiment, the processing logic can utilize the camera to align the first probe or the second probe—e.g., capture the two-dimensional image concurrent with performing the three-dimensional scan. In at least one embodiment, the processing logic can capture the two-dimensional image after performing the three-dimensional scan but before aligning the first probe and the second probe.

Figure 5:
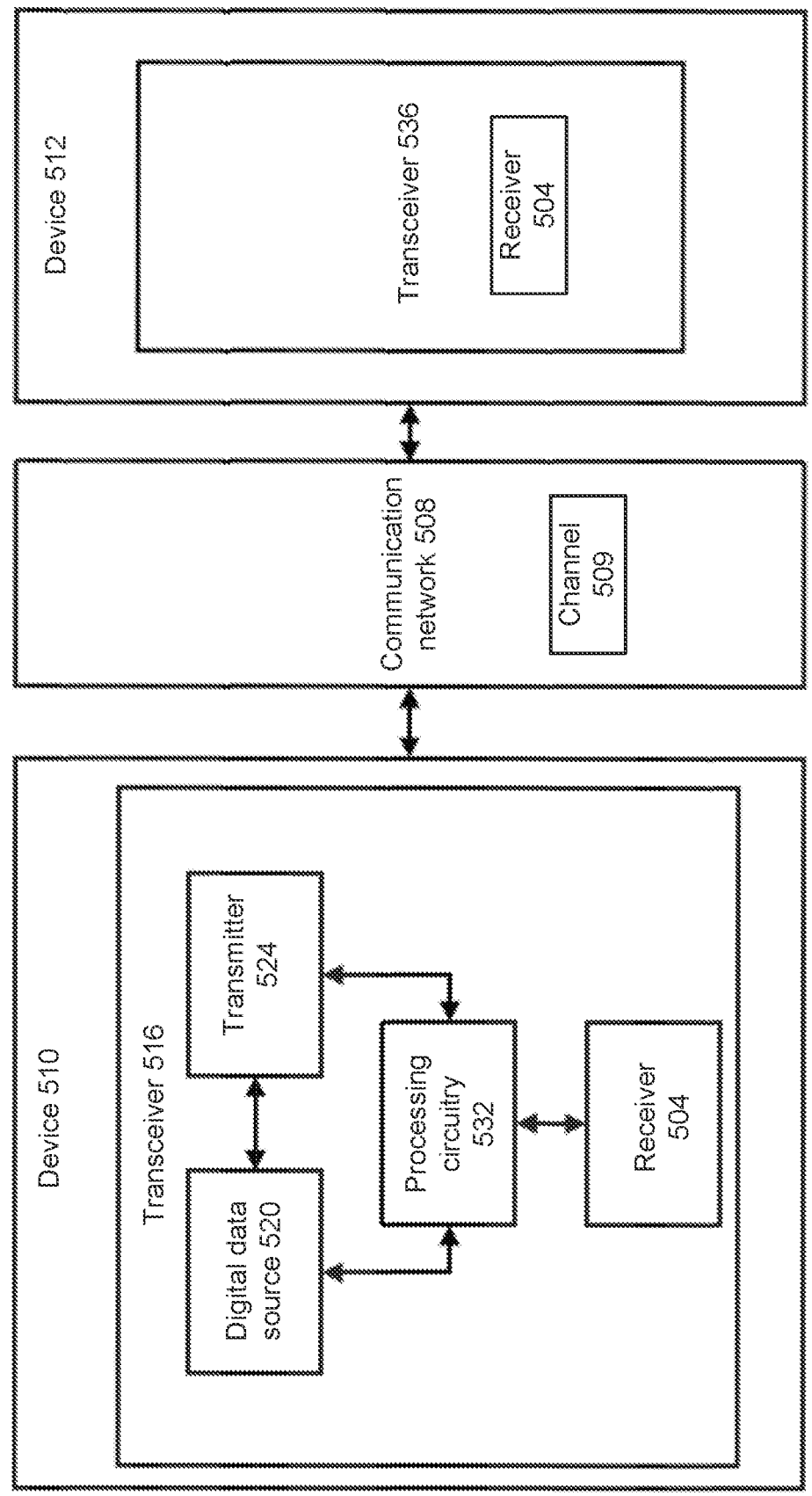
FIG. 5 is an example communication system, in accordance with at least some embodiments.

FIG. 5 illustrates an example communication system 500 according to at least one example embodiment. The system 500 includes a device 510, a communication network 508 including a communication channel 509, and a device 512. In at least one embodiment, devices 510 and 512 are two end-point devices in a computing system, such as a central processing unit (CPU) or graphics processing unit (GPU). In at least one embodiment, devices 510 and 512 are two servers. In at least one example embodiment, devices 510 and 512 correspond to one or more of a Personal Computer (PC), a laptop, a tablet, a smartphone, a server, a collection of servers, or the like. In some embodiments, the devices 510 and 512 may correspond to any appropriate type of device that communicates with other devices connected to a common type of communication network 508. According to embodiments, the receiver 504 of devices 510 or 512 may correspond to a GPU, a switch (e.g., a high-speed network switch), a network adapter, a CPU, a memory device, an input/output (I/O) device, other peripheral devices or components on a system-on-chip (SoC), or other devices and components at which a signal is received or measured, etc. As another specific but non-limiting example, the devices 510 and 512 may correspond to servers offering information resources, services, and/or applications to user devices, client devices, or other hosts in the system 100. In one example, devices 510 and 512 may correspond to network devices such as switches, network adapters, or data processing units (DPUs).

Examples of the communication network 508 that may be used to connect the devices 510 and 512 include an Internet Protocol (IP) network, an Ethernet network, an InfiniBand (IB) network, a Fibre Channel network, the Internet, a cellular communication network, a wireless communication network, a ground referenced signaling (GRS) link, combinations thereof (e.g., Fibre Channel over Ethernet), variants thereof, and/or the like. In one specific but non-limiting example, the communication network 508 is a network that enables data transmission between the devices 510 and 512 using data signals (e.g., digital, optical, wireless signals).

The device 510 includes a transceiver 516 for sending and receiving signals, for example, data signals. The data signals may be digital or optical signals modulated with data or other suitable signals for carrying data.

The transceiver 516 may include a digital data source 520, a transmitter 524, a receiver 504, and processing circuitry 532 that controls the transceiver 516. The digital data source 520 may include suitable hardware and/or software for outputting data in a digital format (e.g., in binary code and/or thermometer code). The digital data output by the digital data source 520 may be retrieved from memory (not illustrated) or generated according to input (e.g., user input).

The transmitter 524 includes suitable software and/or hardware for receiving digital data from the digital data source 520 and outputting data signals according to the digital data for transmission over the communication network 508 to a receiver 504 of device 512. Additional details of the structure of the transmitter 524 are discussed in more detail below with reference to the figures.

The receiver 504 of device 510 and 512 may include suitable hardware and/or software for receiving signals, such as data signals from the communication network 508. For example, the receiver 504 may include components for receiving processing signals to extract the data for storing in a memory, as described in detail below with respect to FIG. 6.

The processing circuitry 532 may comprise software, hardware, or a combination thereof. For example, the processing circuitry 532 may include a memory including executable instructions and a processor (e.g., a microprocessor) that executes the instructions on the memory. The memory may correspond to any suitable type of memory device or collection of memory devices configured to store instructions. Non-limiting examples of suitable memory devices that may be used include Flash memory, Random Access Memory (RAM), Read Only Memory (ROM), variants thereof, combinations thereof, or the like. In some embodiments, the memory and processor may be integrated into a common device (e.g., a microprocessor may include integrated memory). Additionally or alternatively, the processing circuitry 532 may comprise hardware, such as an application-specific integrated circuit (ASIC). Other non-limiting examples of the processing circuitry 532 include an Integrated Circuit (IC) chip, a Central Processing Unit (CPU), a General Processing Unit (GPU), a microprocessor, a Field Programmable Gate Array (FPGA), a collection of logic gates or transistors, resistors, capacitors, inductors, diodes, or the like. Some or all of the processing circuitry 532 may be provided on a Printed Circuit Board (PCB) or collection of PCBs. It should be appreciated that any appropriate type of electrical component or collection of electrical components may be suitable for inclusion in the processing circuitry 532. The processing circuitry 532 may send and/or receive signals to and/or from other elements of the transceiver 516 to control the overall operation of the transceiver 516.

The transceiver 516 or selected elements of the transceiver 516 may take the form of a pluggable card or controller for the device 510. For example, the transceiver 516 or selected elements of the transceiver 516 may be implemented on a network interface card (NIC).

The device 512 may include a transceiver 536 for sending and receiving signals, for example, data signals over a channel 509 of the communication network 508. The same or similar structure of the transceiver 516 may be applied to transceiver 536, and thus, the structure of transceiver 536 is not described separately.

Although not explicitly shown, it should be appreciated that devices 510 and 512 and the transceivers 516 and 536 may include other processing devices, storage devices, and/or communication interfaces generally associated with computing tasks, such as sending and receiving data.

In some embodiments, components of the communication system 500 may be tested during a fabrication process. For example, substrates (e.g., wafers and dies) of the communication system 500 can be tested during fabrication. In some embodiments, a substrate test can be performed at a substrate testing device as described herein. The substrate testing device can include a three-dimensional scanner as well as testing components associated with electrical and optical tests of the substrate. Accordingly, the substrate testing device has the capability to perform optical, electrical, and geometric testing (e.g., testing of a surface topography of the substrate). In some embodiments, the substrate testing device can perform the optical, electrical, and geometric tests in parallel or concurrently. In other embodiments, the substrate testing device can perform the three-dimensional testing at a different time than the electrical or optical tests.

Figure 6:
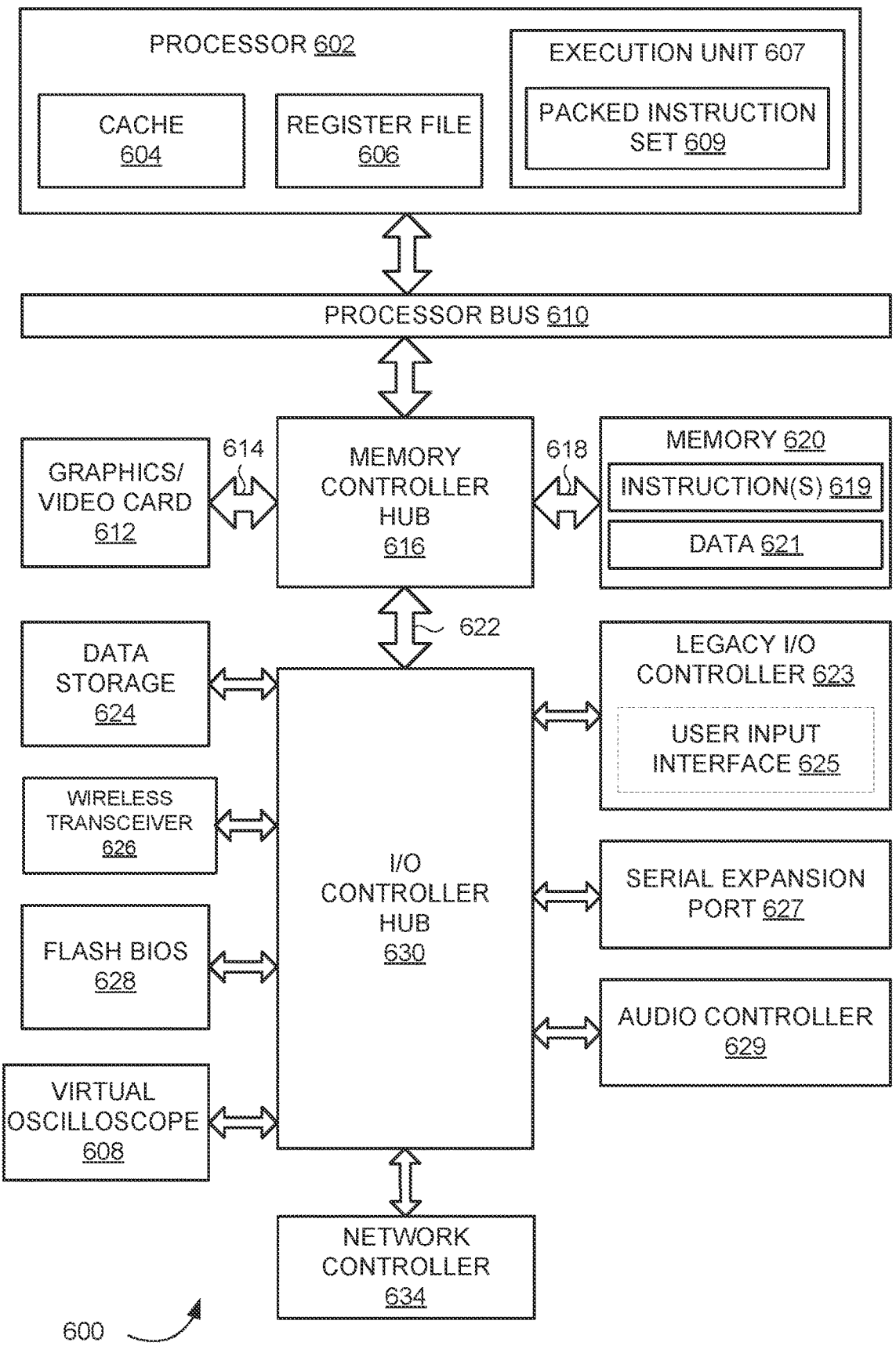
FIG. 6 illustrates an example computer system including a transceiver including a chip-to-chip interconnect, in accordance with at least some embodiments.

FIG. 6 illustrates a computer system 600 in accordance with at least one embodiment. In at least one embodiment, computer system 600 may be a system with interconnected devices and components, an SOC, or some combination. In at least one embodiment, computer system 600 is formed with a processor 602 that may include execution units to execute an instruction. In at least one embodiment, computer system 600 may include, without limitation, a component, such as processor 602 to employ execution units including logic to perform algorithms for processing data. In at least one embodiment, computer system 600 may include processors, such as PENTIUM® Processor family, Xeon™, Itanium®, XScale™ and/or StrongARM™, Intel® Core™, or Intel® Nervana™ microprocessors available from Intel Corporation of Santa Clara, California, although other systems (including PCs having other microprocessors, engineering workstations, set-top boxes and like) may also be used. In at least one embodiment, computer system 600 may execute a version of WINDOWS' operating system available from Microsoft Corporation of Redmond, Wash., although other operating systems (UNIX and Linux for example), embedded software, and/or graphical user interfaces, may also be used.

In at least one embodiment, computer system 600 may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor ("DSP"), an SoC, network computers ("NetPCs"), set-top boxes, network hubs, wide area network ("WAN") switches, or any other system that may perform one or more instructions. In an embodiment, computer system 600 may be used in devices such as graphics processing units (GPUs), network adapters, central processing units and network devices such as switch (e.g., a high-speed direct GPU-to-GPU interconnect such as the NVIDIA GH100 NVLINK or the NVIDIA Quantum 2 64 Ports InfiniBand NDR Switch).

In at least one embodiment, computer system 600 may include, without limitation, processor 602 that may include, without limitation, one or more execution units 607 that may be configured to execute a Compute Unified Device Architecture ("CUDA") (CUDA® is developed by NVIDIA Corporation of Santa Clara, CA) program. In at least one embodiment, a CUDA program is at least a portion of a software application written in a CUDA programming language. In at least one embodiment, computer system 600 is a single processor desktop or server system. In at least one embodiment, computer system 600 may be a multiprocessor system. In at least one embodiment, processor 602 may include, without limitation, a CISC microprocessor, a RISC microprocessor, a VLIW microprocessor, a processor implementing a combination of instruction sets, or any other processor device, such as a digital signal processor, for example. In at least one embodiment, processor 602 may be coupled to a processor bus 610 that may transmit data signals between processor 602 and other components in computer system 600.

In at least one embodiment, processor 602 may include, without limitation, a Level 1 ("L1") internal cache memory ("cache") 604. In at least one embodiment, processor 602 may have a single internal cache or multiple levels of internal cache. In at least one embodiment, cache memory may reside external to processor 602. In at least one embodiment, processor 602 may also include a combination of both internal and external caches. In at least one embodiment, a register file 606 may store different types of data in various registers including, without limitation, integer registers, floating point registers, status registers, and instruction pointer register.

In at least one embodiment, execution unit 607, including, without limitation, logic to perform integer and floating point operations, also resides in processor 602. Processor 602 may also include a microcode ("ucode") read only memory ("ROM") that stores microcode for certain macro instructions. In at least one embodiment, execution unit 602 may include logic to handle a packed instruction set 609. In at least one embodiment, by including packed instruction set 609 in an instruction set of a general-purpose processor 602, along with associated circuitry to execute instructions, operations used by many multimedia applications may be performed using packed data in a general-purpose processor 602. In at least one embodiment, many multimedia applications may be accelerated and executed more efficiently by using full width of a processor's data bus for performing operations on packed data, which may eliminate a need to transfer smaller units of data across a processor's data bus to perform one or more operations one data element at a time.

In at least one embodiment, an execution unit may also be used in microcontrollers, embedded processors, graphics devices, DSPs, and other types of logic circuits. In at least one embodiment, computer system 600 may include, without limitation, a memory 620. In at least one embodiment, memory 620 may be implemented as a DRAM device, an SRAM device, flash memory device, or other memory device. Memory 620 may store instruction(s) 619 and/or data 621 represented by data signals that may be executed by processor 602.

In at least one embodiment, a system logic chip may be coupled to processor bus 610 and memory 620. In at least one embodiment, the system logic chip may include, without limitation, a memory controller hub ("MCH") 616, and processor 602 may communicate with MCH 616 via processor bus 610. In at least one embodiment, MCH 616 may provide a high bandwidth memory path 618 to memory 620 for instruction and data storage and for storage of graphics commands, data and textures. In at least one embodiment, MCH 616 may direct data signals between processor 602, memory 620, and other components in computer system 600 and to bridge data signals between processor bus 610, memory 620, and a system I/O 622. In at least one embodiment, system logic chip may provide a graphics port for coupling to a graphics controller. In at least one embodiment, MCH 616 may be coupled to memory 620 through high bandwidth memory path 618 and graphics/video card 612 may be coupled to MCH 616 through an Accelerated Graphics Port ("AGP") interconnect 614.

In at least one embodiment, computer system 600 may use system I/O 622 that is a proprietary hub interface bus to couple MCH 616 to I/O controller hub ("ICH") 630. In at least one embodiment, ICH 630 may provide direct connections to some I/O devices via a local I/O bus. In at least one embodiment, local I/O bus may include, without limitation, a high-speed I/O bus for connecting peripherals to memory 620, a chipset, and processor 602. Examples may include, without limitation, an audio controller 629, a firmware hub ("flash BIOS") 628, a transceiver 626, a data storage 624, a legacy I/O controller 623 containing a user input interface 625 and a keyboard interface, a serial expansion port 627, such as a USB, and a network controller 634. Data storage 624 may comprise a hard disk drive, a floppy disk drive, a CD-ROM device, a flash memory device, or other mass storage device.

In at least one embodiment, FIG. 6 illustrates a system, which includes interconnected hardware devices or "chips" in a transceiver 626—e.g., the transceiver 626 includes a chip-to-chip interconnect including the first device 510 and second device 512 as described with reference to FIG. 1). In at least one embodiment, FIG. 6 may illustrate an exemplary SoC. In at least one embodiment, devices illustrated in FIG. 6 may be interconnected with proprietary interconnects, standardized interconnects (e.g., PCIe), or some combination thereof and utilize a GRS link. In at least one embodiment, one or more components of system 600 are interconnected using compute express link ("CXL") interconnects. In an embodiment, components of computer system 600 may be tested during a fabrication process as described with reference to FIGS. 1-3. In such embodiments, the components of the computer system 600 can be tested by a substrate testing system 100 as described with reference to FIG. 1. In at least one embodiment, computer system 600 may correspond to or include the processing device 151 as described with reference to FIG. 1. In at least one embodiment, the computer system 600 may control the substrate testing system 100 as described with reference to FIG. 1. In some embodiments, computer system 600 may process or otherwise handle the data output by substrate test system 100 or display such data via a graphical user interface (GUI) of computer system 600.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more of individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. In at least one embodiment, terms "system" and "method" are used herein interchangeably insofar as the system may embody one or more methods and methods may be considered a system.

In the present document, references may be made to obtaining, acquiring, receiving, or inputting analog or digital data into a subsystem, computer system, or computer-implemented machine. In at least one embodiment, the process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A substrate testing device comprising:
   a first testing component configured to couple to electrical pads of a substrate and perform electrical testing on one or more dies of the substrate during a test;
   a second testing component configured to perform optical testing of the one or more dies during the test; and
   a third testing component comprising a three-dimensional scanner configured to perform one or more three-dimensional scans of the one or more dies in order to perform geometrical testing on the one or more dies during the test and to perform an alignment of the first testing component and the second testing component with respect to the substrate.

2. The substrate testing device of claim 1, wherein the substrate testing device further comprises:
   a gantry, wherein the three-dimensional scanner is coupled to the gantry; and
   a camera coupled to the gantry and configured to capture two-dimensional images of the one or more dies during the test.

3. The substrate testing device of claim 1, wherein the three-dimensional scanner is further configured to capture two-dimensional images during the test.

4. The substrate testing device of claim 1, wherein the three-dimensional scanner is configured to perform at least one of a structured-light three-dimensional scan, a time of flight scan, a confocal scan, a stereo camera array scan, or any combination thereof to generate three-dimensional data.

5. The substrate testing device of claim 1, wherein the substrate is a wafer comprising a silicon photonic or a micro-electromechanical system (MEMS).

6. The substrate testing device of claim 1, wherein, to perform the alignment with respect to at least one of the electrical testing or the optical testing, the substrate testing device is further to:
   align at least a probe associated with the second testing component with the one or more dies of the substrate based at least in part on a result of the three-dimensional scan.

7. The substrate testing device of claim 1, wherein the three-dimensional scanner is further configured to scan and determine dimensions of a groove in the substrate.

8. The substrate testing device of claim 1, wherein the substrate testing device is configured to perform the electrical testing, the optical testing, and the geometrical testing concurrently.

9. The substrate testing device of claim 1, wherein the one or more three-dimensional scans are performed with respect to an area of interest on the substrate located underneath the third testing component.

10. A method comprising:
    aligning, based at least in part on a result of a first three-dimensional scan, at least a first component of a substrate testing device associated with an electrical test to a die of a substrate;
    aligning, based at least in part on a result of the first three-dimensional scan, at least a second component of the substrate testing device associated with an optical test to the die of the substrate;
    performing the electrical test and the optical test of the die based at least in part on aligning the first component and the second component; and
    performing, via a three-dimensional scanner of the substrate testing device, a second three-dimensional scan of the die of the substrate.

11. The method of claim 10, wherein the three-dimensional scan of the die is concurrent with performance of the electrical test and the optical test.

12. The method of claim 10, wherein the first component and second component are aligned concurrently.

13. The method of claim 10, wherein the first component is aligned before the second component.

14. The method of claim 10, further comprising capturing, via a camera, two-dimensional images of the die.

15. The method of claim 10, wherein the first component comprises a probe, and wherein the second component comprises an optical fiber.

16. The method of claim 10, wherein performing at least one of the first three-dimensional scan or the second three-dimensional scan comprises generating three-dimensional data by performing at least one of: a structured-light three-dimensional scan, a time of flight scan, a confocal scan, a stereo camera array scan, or any combination thereof.

17. A method comprising:
    performing, via a three-dimensional scanner of a substrate testing device, a three-dimensional scan of a die of a substrate;
    aligning, based at least in part on a result of the three-dimensional scan, at least one component of the substrate testing device with respect to the die of the substrate, wherein the at least one component is associated with at least one of: an electrical test to the die of the substrate or an optical test to the die of the substrate; and
    performing at least one of the electrical test or the optical test of the die based at least in part on the aligning.

18. The method of claim 17, wherein the at least one component comprises a probe associated with the electrical test and an optical fiber associated with the optical test, and wherein the probe and the optical fiber are aligned concurrently.

19. The method of claim 17, wherein the at least one component comprises a probe associated with the electrical test and an optical fiber associated with the optical test, and wherein the probe is aligned before the optical fiber.

20. The method of claim 17, wherein the three-dimensional scan is performed with respect to an area of interest on the substrate located underneath the three-dimensional scanner.

* * * * *